United States Patent
Gaul et al.

(10) Patent No.: US 8,426,745 B2
(45) Date of Patent: Apr. 23, 2013

(54) THIN FILM RESISTOR

(75) Inventors: Stephen Jospeh Gaul, Melbourne Village, FL (US); Michael David Church, Sebastian, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/868,659

(22) Filed: Aug. 25, 2010

(65) Prior Publication Data

US 2011/0128692 A1  Jun. 2, 2011

Related U.S. Application Data

(60) Provisional application No. 61/264,942, filed on Nov. 30, 2009, provisional application No. 61/318,856, filed on Mar. 30, 2010.

(51) Int. Cl.
*H05K 1/16* (2006.01)
*H05K 7/00* (2006.01)
*H05K 3/02* (2006.01)
*H01L 23/48* (2006.01)
*H01L 21/00* (2006.01)
*H01K 3/10* (2006.01)

(52) U.S. Cl.
USPC ........... 174/260; 257/750; 257/758; 257/774; 361/783; 29/847; 29/852; 438/381; 438/382; 438/384

(58) Field of Classification Search ........... 29/847; 174/260; 257/750, 758, E27.016, E27.116, 257/528, 530, 536; 361/783, 762, 679.31; 438/637, 689, 706, 384, 381, 382
See application file for complete search history.

(56) References Cited

U.S. PATENT DOCUMENTS

| | | | | |
|---|---|---|---|---|
| 3,996,551 A * | 12/1976 | Croson | ......................... | 338/309 |
| 4,139,833 A * | 2/1979 | Kirsch | ......................... | 338/308 |
| 4,473,940 A * | 10/1984 | Kiriseko | ......................... | 438/363 |
| 4,517,444 A * | 5/1985 | Kawahito et al. | ......................... | 347/204 |
| 4,617,575 A * | 10/1986 | Fuyama et al. | ......................... | 347/203 |
| 4,928,838 A * | 5/1990 | Imamura | ......................... | 219/121.69 |
| 4,975,386 A * | 12/1990 | Rao | ......................... | 438/384 |
| 5,468,672 A * | 11/1995 | Rosvold | ......................... | 438/385 |

(Continued)

FOREIGN PATENT DOCUMENTS

CN  1337745  2/2002

OTHER PUBLICATIONS

Chinese Patent Office, "Office Action", "from Foreign Counterpart of U.S. Appl. No. 12/868,659", Sep. 24, 2012, pp. 1-28, Published in: CN.

(Continued)

*Primary Examiner* — Timothy Thompson
*Assistant Examiner* — Sherman Ng
(74) *Attorney, Agent, or Firm* — Fogg & Powers LLC

(57) ABSTRACT

A method and structure for a semiconductor device which provides for an etch of a metal layer such as an interconnect layer which does not affect a thinner layer such as a thin film resistor (TFR) layer, such as a circuit resistor. In one embodiment, a TFR resistor layer is protected by a patterned protective layer during an etch of the metal layer, and provides an underlayer for the metal layer. In another embodiment, the TFR layer is formed after providing the patterned metal layer. The metal layer can provide, for example, end caps for the circuit resistor.

22 Claims, 9 Drawing Sheets

U.S. PATENT DOCUMENTS

| | | | |
|---|---|---|---|
| 5,500,553 A * | 3/1996 | Ikegami | 257/538 |
| 5,503,878 A * | 4/1996 | Suzuki et al. | 216/16 |
| 5,525,831 A * | 6/1996 | Ohkawa et al. | 257/543 |
| 5,989,970 A * | 11/1999 | Ohkawa et al. | 438/384 |
| 6,165,862 A * | 12/2000 | Ishikawa et al. | 438/384 |
| 6,225,183 B1 * | 5/2001 | Lee | 438/384 |
| 6,326,256 B1 * | 12/2001 | Bailey et al. | 438/238 |
| 6,365,480 B1 | 4/2002 | Huppert et al. | |
| 6,426,268 B1 * | 7/2002 | Huppert et al. | 438/384 |
| 6,497,824 B1 | 12/2002 | Chen et al. | |
| 6,724,452 B1 * | 4/2004 | Takeda et al. | 349/139 |
| 6,809,034 B2 * | 10/2004 | Ito et al. | 438/706 |
| 6,855,585 B1 | 2/2005 | Kalnitsky et al. | |
| 6,872,655 B2 * | 3/2005 | Mahalingam et al. | 438/637 |
| 7,084,478 B2 * | 8/2006 | Lee et al. | 257/516 |
| 7,223,668 B2 * | 5/2007 | Ito et al. | 438/384 |
| 2001/0019301 A1 | 9/2001 | Shibuya et al. | |
| 2003/0017699 A1 * | 1/2003 | Zurcher et al. | 438/687 |
| 2003/0062595 A1 * | 4/2003 | Anthony | 257/530 |
| 2004/0063295 A1 * | 4/2004 | Chambers et al. | 438/382 |
| 2004/0152299 A1 * | 8/2004 | Mahalingam et al. | 438/637 |
| 2004/0241951 A1 * | 12/2004 | Amadon et al. | 438/382 |
| 2004/0245575 A1 * | 12/2004 | Beach et al. | 257/359 |
| 2005/0032279 A1 * | 2/2005 | Forbes et al. | 438/131 |
| 2005/0040494 A1 * | 2/2005 | Huttemann et al. | 257/536 |
| 2005/0218473 A1 * | 10/2005 | Wakisaka | 257/528 |
| 2006/0181388 A1 * | 8/2006 | Chinthakindi et al. | 338/309 |
| 2006/0286696 A1 * | 12/2006 | Peiffer et al. | 438/27 |
| 2007/0012666 A1 * | 1/2007 | Yamashita | 219/121.69 |
| 2007/0046421 A1 | 3/2007 | Gogineni et al. | |
| 2007/0069334 A1 * | 3/2007 | Beach et al. | 257/536 |
| 2007/0158781 A1 * | 7/2007 | Khan et al. | 257/529 |
| 2008/0132058 A1 * | 6/2008 | Yang et al. | 438/637 |
| 2010/0258909 A1 * | 10/2010 | Hoyt et al. | 257/536 |

OTHER PUBLICATIONS

Korean Patent Office, "Office Action", Aug. 31, 2012, pp. 1-7, Published in: KR.

* cited by examiner

THIN FILM RESISTOR

RELATED APPLICATIONS

This application claims benefit to U.S. provisional application Ser. No. 61/264,942 filed Nov. 30, 2009 and to U.S. provisional application Ser. No. 61/318,856 filed Mar. 30, 2010, each of which is incorporated herein by reference.

DESCRIPTION OF THE EMBODIMENTS

Reference will be made below in detail to exemplary embodiments of the present teachings to form a thin film resistor (TFR), examples of which are illustrated in the accompanying drawings. Wherever possible, the same reference numbers will be used throughout the drawings to refer to the same or like parts. The accompanying drawings, which are incorporated in and constitute a part of this specification, illustrate embodiments of the present teachings and together with the description, serve to explain the principles of the present teachings. In the figures:

FIGS. 1-4 are cross sections, and FIG. 5 is a plan view, of various structures formed during a first embodiment of the present teachings;

FIGS. 6-10, 12, and 13 are cross sections, and FIG. 11 is a plan view, of various structures formed during a second embodiment of the present teachings;

It should be noted that some details of the FIGS. have been simplified and are drawn to facilitate understanding of the embodiments of the present teachings rather than to maintain strict structural accuracy, detail, and scale.

Figure 1:
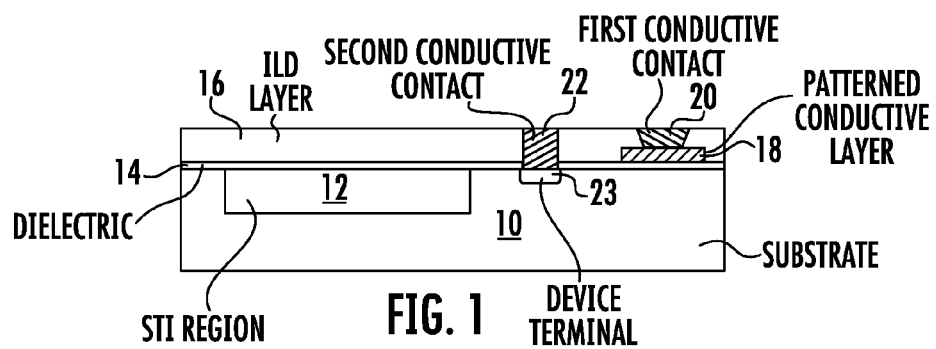

FIG. 1 depicts a semiconductor wafer substrate assembly that can be completed according to known processing techniques. The substrate assembly can include, for example, a semiconductor substrate 10 such as a semiconductor wafer having a dielectric shallow trench isolation (STI) region 12. FIG. 1 further depicts dielectric layers including dielectric 14 such as gate dielectric (gate oxide) and an interlevel dielectric (ILD) layer 16, a patterned conductive layer 18, for example polysilicon, a patterned first conductive contact 20 such as a metal contact electrically coupled to the conductive layer 18, and a patterned second conductive contact 22 such as a metal contact electrically coupled with a semiconductor device terminal 23 such as a metal oxide semiconductor (MOS) source or drain diffusion implanted within semiconductor substrate 10.

Figure 2:
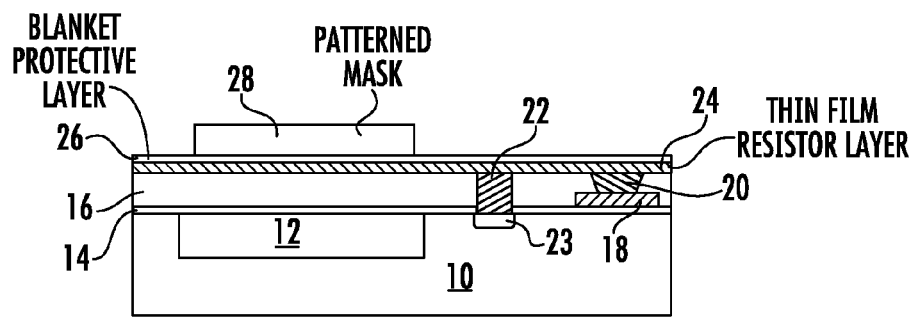

After completing a structure similar to that depicted in FIG. 1, a blanket conductive thin film resistor (TFR) layer 24 can be formed as depicted in FIG. 2, followed by a blanket protective layer 26. In this exemplary embodiment, the TFR layer 24 can include one or more of nickel-chromium (NiCr) or silicon-chromium (SiCr), and can be between about 50 Å to about 500 Å thick, for example in the range of about 50 Å to about 300 Å thick. The TFR layer 24 can be formed using sputter deposition, physical vapor deposition (PVD), etc. The TFR layer can provide a circuit resistor, and may be used at other locations on the semiconductor substrate 10 for other uses. The protective layer 26 can include silicon dioxide, silicon nitride, or another nonconductive layer that can be etched selective to TFR layer 24.

The protective layer 26 can be tailored to provide correct conditions to anneal the TFR layer. For example, an oxidizing condition can be provided using a deposited oxide with composition $SiO_n$, where n is >2 to tailor the oxide composition of protective layer 26 to provide the correct oxidizing environment at the surface of the completed thin film resistor layer 24. This provides a process to fine tune the lifetime drift of the resistor value and the resistor temperature coefficient, as well as a method to stabilize the resistor throughout its usable lifetime. Oxides in the form $SiO_n$ where n<2, or where n=2, may also be selected in some uses of the present teachings.

Next, a first patterned mask 28, for example photoresist (resist), is formed over the protective layer 26, then the protective layer is patterned while leaving the TFR layer 24 unetched, or minimally etched. The TFR layer 24 can thereby remain a blanket layer subsequent to patterning the protective layer 26. An etch that is highly selective to SiCr and NiCr while etching silicon dioxide includes the use of a buffered hydrofluoric acid.

Figure 3:
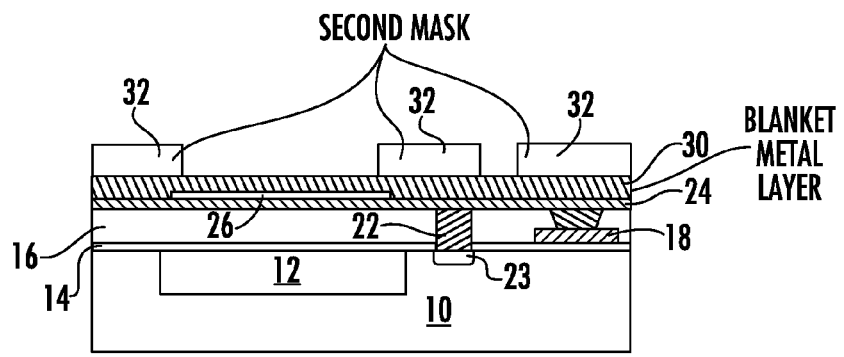

After etching the protective layer 26 and removing the first mask 28, a blanket metal layer 30 can be formed over the patterned protective layer 26 and the blanket TFR layer 24 as depicted in FIG. 3. Metal layer 30 can include one or more of aluminum and copper, and can also include multiple metal layers, such as titanium nitride (TiN) and aluminum (Al). Additional contact metallurgy layers or anti-reflective layers can be added to provide for metal system stability and photoresist patterning accuracy, respectively. Such metal system layers can be between about 3,000 Å and about 30,000 Å thick, depending on whether a metal interconnect as described below includes a top metallization (last metal interconnect) or an underlying metal layer. The metal layer 30 can function as an interconnect between other conductive features (not depicted for brevity), but may provide other device functionality depending on the device design. For example, metal 30 can provide a metallization layer used for a metal/insulator/metal (MIM) capacitor at another device location. A MIM capacitor which can use metal 30 for another use is depicted and described below with reference to FIG. 15.

A second mask 32 such as a patterned resist layer is formed over the blanket metal layer 30, then exposed portions of the blanket metal layer 30 and TFR layer 24 are etched. After etching, the first mask 32 is removed to result in a structure similar to FIG. 4.

Figure 4:
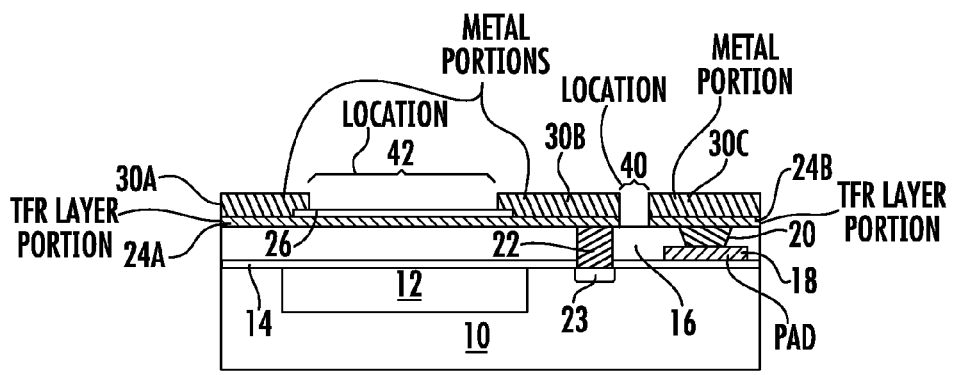

The etch of metal layer 30 forms metal portions 30A, 30B, and 30C as depicted in FIG. 4, which can be electrically isolated from each other. As depicted in the cross section of FIG. 4 and the FIG. 5 plan view of the FIG. 4 structure, the TFR layer 24 can remain under all locations where the metal layer 30 remains, and thus provides an underlayer for the metal layer 30.

It should be noted that for purposes of the present teachings, an "underlayer" is a first layer that underlies a second layer at all locations of the second layer. The underlayer can also be formed at one or more locations where the second layer is not formed. The metal system layers may include a main conductive layer such as aluminum or copper, and can include underlayers such as titanium nitride, to assist with the contact metallurgy, as well as layers deposited over conductive layer 30 to provide an anti-reflective layer for improved photoresist definition. For the purposes of the present teachings and simplicity, only one metal layer 30 is shown in the FIGS., as other metal layers formed under or over metal layer 30 will depend on the other structures being formed.

Layer 30 provides thin film resistor end cap metallization (end caps) 30A and 30B. The resistance of the thin film resistor is determined mainly by the sizing and composition of TFR layer portion 24A. Metal layer portion 30C and TFR layer 24B can provide an interconnect which routes a signal between pad 18 through contact 20 and another location on the semiconductor substrate 10.

Further, TFR layer portion 24A which mainly determines the resistance of the TFR is not exposed to an etch (other than the etch that defines the shape of portion 24A). That is, the horizontal surface of portion 24A is protected by protective layer 26 and second mask 32 during an etch process that etches layer 30 to form portions 30A-30C.

At locations 40, both the metal layer 30 and TFR layer 24 are etched, and at locations 42 the metal layer 30 is etched while the TFR layer 24 is not etched. The protective layer 26 prevents etching of the TFR layer 24 at locations 42. At location 42, the TFR layer 24 can provide a resistor having a resistance determined by the thickness, length, width, and composition of the TFR layer 24 that remains under the protective layer 26. TFR layer 24 provides an underlayer for the protective layer. The etch that removes the metal layer 30 exposes the protective layer 26, and the protective layer 26 protects TFR layer 24 to preserve the full thickness of the TFR layer 24 at location 42. Metallization 30A and 30B can contact the TFR layer 24 where the TFR layer 24 is exposed laterally at both the ends of the protective layer 26 and provide resistor end cap metallization. Resistance of the TFR layer 24 under the protective layer 26 is thus defined in part by controlling the length and width of the protective layer 26. In an embodiment, the blanket TFR layer 24 remains unetched prior to etching the blanket metal layer 30, and is etched subsequent to etching the blanket metal layer 30.

It will be understood that a thickness required for the protective layer 26 over the TFR layer 24 is at least partly determined by the selectivity of the metal etch that etches metal layer 30 to expose the protective layer 26. Further, the selectivity of the etch that patterns the protective layer 26 selective to TFR layer 24 will establish the thickness of the TFR layer 24 that remains in the regions which are not protected by protective layer 26. The thickness of the remaining TFR layer 24 will affect a contact resistance between the TFR layer 24 and the metallization layer 30, where contact to the TFR layer 24A is made in metal contact regions 30A and 30B. In other words, if the exposed portions of TFR layer 24 are unduly etched during patterning of the protective layer 26, the contact resistance between metal layer portions 30A, 30B with the TFR layer 24 may be high. Therefore, an etch that is highly selective to the TFR layer 24 during the etch of the protective layer 26 (i.e. removes protective layer 26 with little or no etching of the TFR layer 24) as described above should be used for the protective layer etch.

Figure 5:
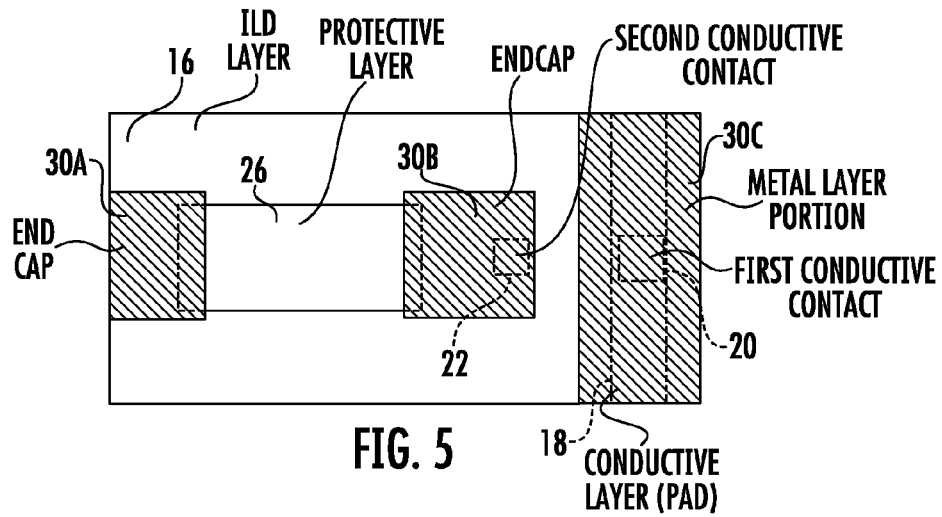

In the structures of FIGS. 4 and 5, TFR layer 24 remains under metal 30A, 30B, and 30C, and under protective layer 26. The etch that patterns metal layer 30 to form metal layer structures 30A-30C also etches TFR layer 24 where it is not protected by the protective layer 26, and thereby sets the resistance of TFR layer 24, as it is a blanket layer prior to etching. As previously discussed, the resistance of TFR layer is predominantly determined by its thickness, composition, and the length and width of protective layer 26. Subsequent temperature operations or anneals will affect this resistance, and should be considered.

An aluminum metal layer 30 and a SiCr or NiCr layer 24 can be etched selective to protective layer 26 and dielectric 16 using, for example, a dry etch including a $Cl_2/BCl_3$ chemistry, or a wet etch including phosphoric acid ($H_3PO_4$). This etch may be terminated as dielectric layer 16 becomes exposed.

Any affect of the TFR layer 24 on the conductivity/resistance of the metal layer portions 30A-30C is expected to be minimal, as the metal layer will be significantly thicker than the TFR layer. For example, as described above, the metal layer portions 30A-30C can have a thickness of from about 3,000 Å and about 30,000 Å, while the TFR layer 24 can have a thickness of from about 50 Å to about 500 Å.

Referring to FIGS. 4 and 5, the process described above provides a thin film resistor where the resistance is determined by the TFR layer 24. The horizontal surface of the TFR layer 24A is not exposed to an etch at a location between end cap metallization. Because TFR layer 24 is relatively thin, any damage or thinning of the layer which can occur during exposure to an etch is avoided. This process may result in a thin film resistor which more closely matches a desired resistor value than a resistor formed with a process which exposes the horizontal portions of the TFR layer to an etch.

Another embodiment of the present teachings is depicted in FIGS. 6-13, which can include a TFR resistor structure formed using an "upside down" approach. This embodiment of the process also avoids an etch of a horizontal surface of a TFR layer. This embodiment can include a semiconductor substrate 100 which may be a semiconductor wafer and blanket dielectric layer 102 such as a gate dielectric (gate oxide), as well as other structures such as STI regions, local oxidation of silicon (LOCOS) oxides, doped regions, conductive structures, etc., which are omitted in the depiction for brevity. In this embodiment, a blanket metal layer 104 can be formed which can provide a similar functionality as layer 30 of the previous embodiment. Metal layer 104 can include one or more of aluminum and copper, and can also include multiple metal layers, such as titanium nitride and aluminum. Additional contact metallurgy layers or anti-reflective layers can be added to provide for metal system stability and photoresist patterning accuracy, respectively. Such metal system layers can be between about 3,000 Å and about 30,000 Å thick. The metal layer 104 can function as an interconnect between other conductive features (not depicted for brevity), but may provide other device functionality depending on the device design.

Figure 6:
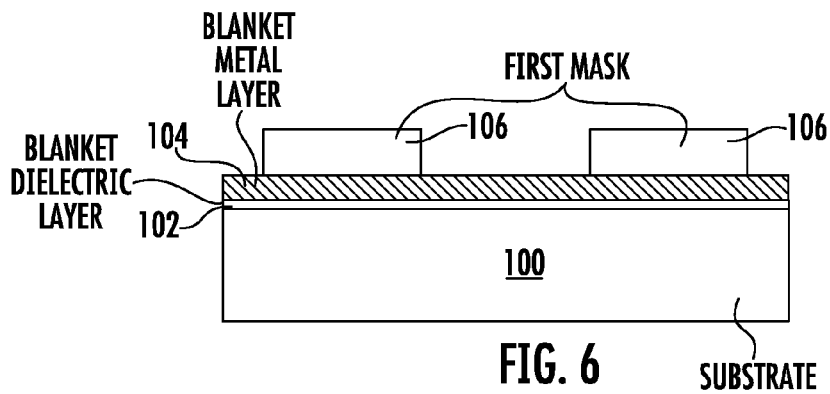

Also depicted in FIG. 6 is a first mask 106, such as a patterned resist layer. After forming the structure of FIG. 6, the metal layer 104 can be etched to expose the blanket dielectric layer 102, then the first mask 106 is removed.

Figure 7:
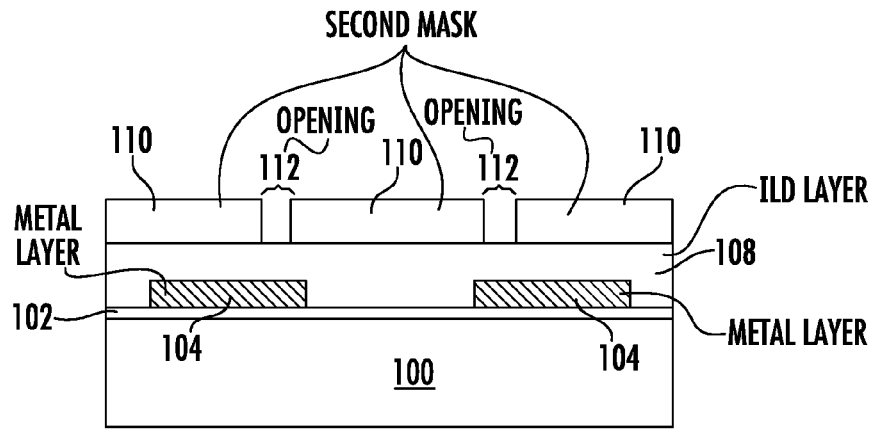

Next, as depicted in FIG. 7, an ILD layer 108 and a second mask 110, such as a patterned resist, are formed. The second mask 110 includes openings 112 which will be used to etch through ILD layer 108 to provide contact openings to metal layer 104. After forming the FIG. 7 structure, the ILD layer 108 is etched to expose the metal layer 104, then the second mask 110 is removed.

Subsequently, a blanket metal layer 120, such as a tungsten layer, is formed over the ILD layer 108 which fills the openings in the ILD layer 108 and contacts metal layer 104. The blanket metal layer 120 can be formed to a thickness sufficient to fill the contact openings 112 (FIG. 7). After forming metal 120, the metal portion overlying the ILD layer 108 is etched or planarized, for example using an isotropic or anisotropic chemical etch or a chemical mechanical planarization (CMP) damascene process, to expose the ILD layer 108. This leaves metal contacts (vias) 130 which are electrically isolated from each other, and which electrically contact metal layer 104 as depicted in FIG. 9.

Figure 8:
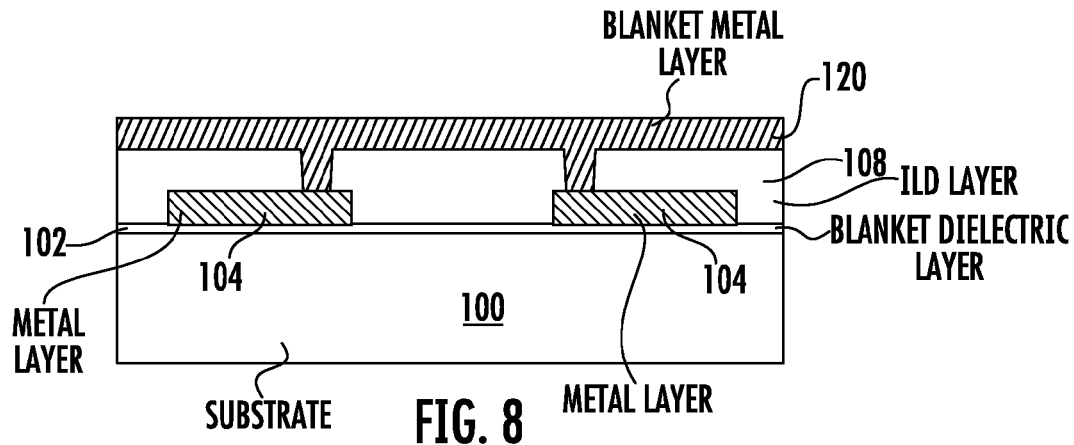
Figure 9:
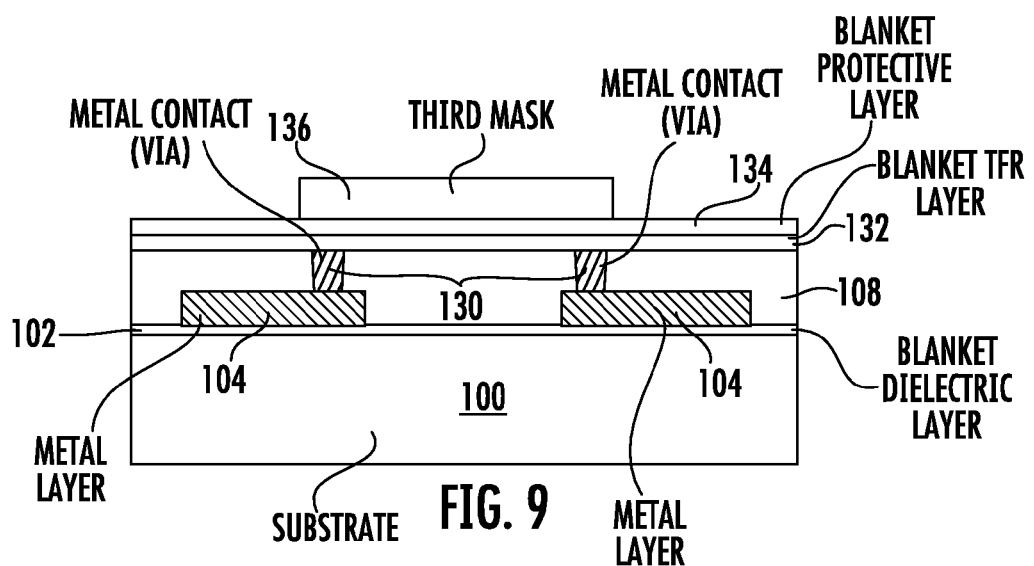
Figure 10:
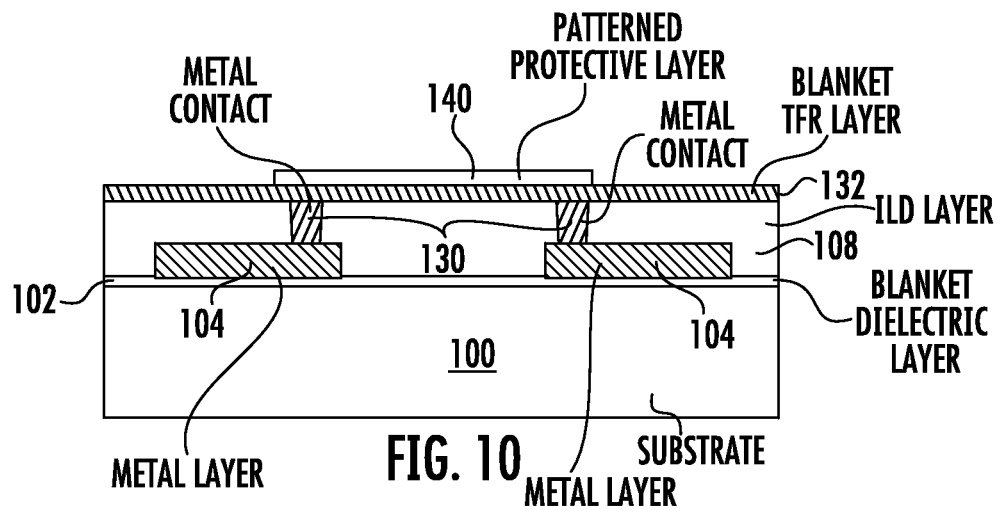
Figure 11:
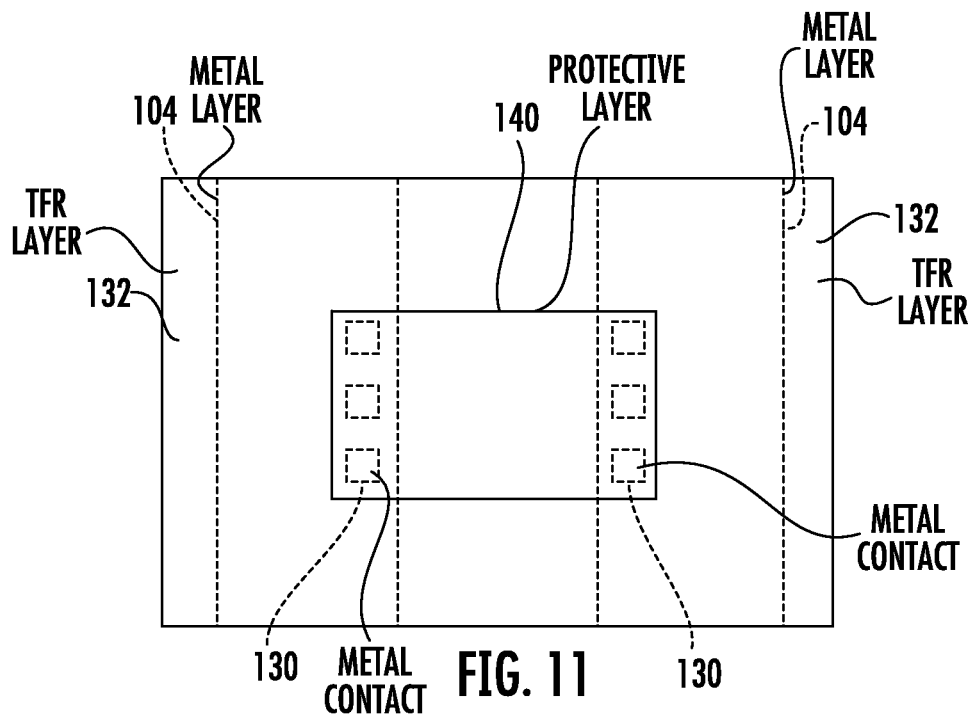

After etching or planarizing metal layer 120 of FIG. 8, a blanket TFR layer 132, such as a NiCr or SiCr layer, for example having a thickness of from about 50 Å to about 500 Å, a blanket protective layer 134 such as silicon dioxide, and a third mask 136, such as a patterned resist layer, are formed as depicted in FIG. 9. Subsequently, the blanket protective layer 134 is etched selective to the TFR layer 132, which results in little or no etching of the TFR layer 132. An etch as described for the previous process would be sufficient. After patterning the blanket protective layer 134, the mask 136 is removed which leaves blanket TFR layer 132 and patterned protective layer 140 as depicted in the cross section of FIG. 10, and the plan view of FIG. 11 which depicts the FIG. 10 structure.

Figure 12:
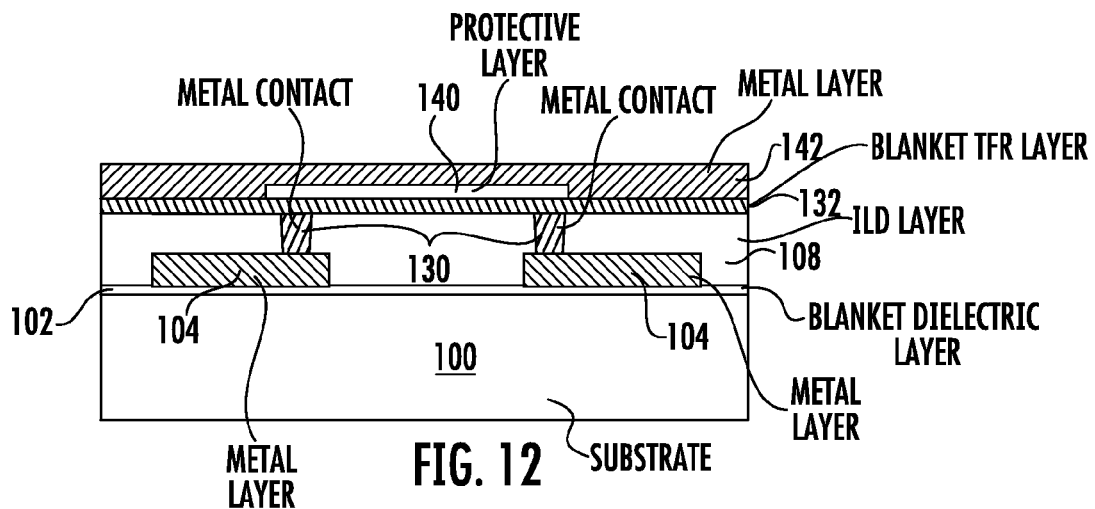

The protective layer 140 can protect the TFR layer 132 during subsequent processing, for example during metal processing. For example, a metal layer 142 as depicted in FIG. 12 can be formed over the TFR layer 132 and the protective layer 140, then etched. As long as the etch of metal layer 132 is selective to the protective layer 140, the portion of TFR layer 132 underlying the protective layer 140 will remain as depicted in FIG. 13.

Wafer processing can continue in accordance with known techniques to form a completed device.

TFR layer 132 can provide a thin film resistor which is not affected by a metal etch. The TFR layer 132 is formed after metal layer 104, and makes contact with the metal layer 104 through the use of contacts 130. Thus this process can include the use of three different metal layers, with a contact layer 130 interposed between metal layer 104 and TFR layer 132.

Figure 13:
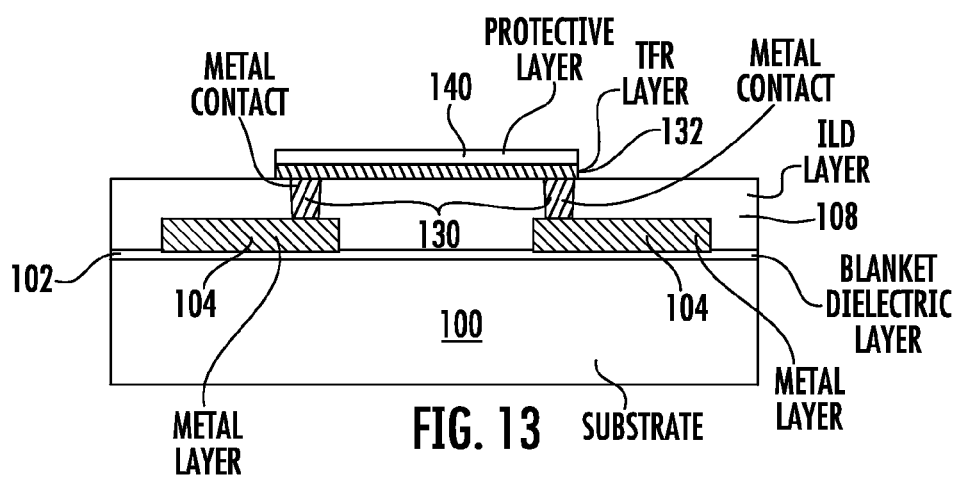

The FIG. 13 structure can provide a circuit resistor for a semiconductor device. Structures 104 can provide resistor end caps for the circuit resistor, with TFR layer 132 providing resistance for the thin film resistor. In this embodiment, the resistance of the circuit resistor is mainly determined by controlling the thickness and composition of the TFR layer 132, the size and composition of the vias 130, the distance between vias 130, and the number of vias at each end of the TFR layer 132. Three vias at each end of the TFR layer 132 are depicted in the plan view of FIG. 11. In this embodiment, the vias 130 are interposed between the TFR layer 132 and the resistor end caps 104.

Chemical mechanical planarization metal processing can include the use of ILD layers deposited over metallization layers. These ILD layers can be planarized using CMP. Electrical contact to structures underlying conductive layers such as metals can include the use of contacts or vias that are metallized using, for example, a tungsten plug process. During the formation of these structures, it is difficult to directly contact thin metallization layers such as those used for thin film resistors. The above embodiments provide methods which avoid etching of the TFR layer by either contact/via etch or interconnect metallization etches. Such contact/via and metallization etches use dry etch processing that can quickly remove the TFR layer because the TFR layer is thin in comparison to the thickness of the ILD or interconnect metallization layer thickness.

Figure 14:
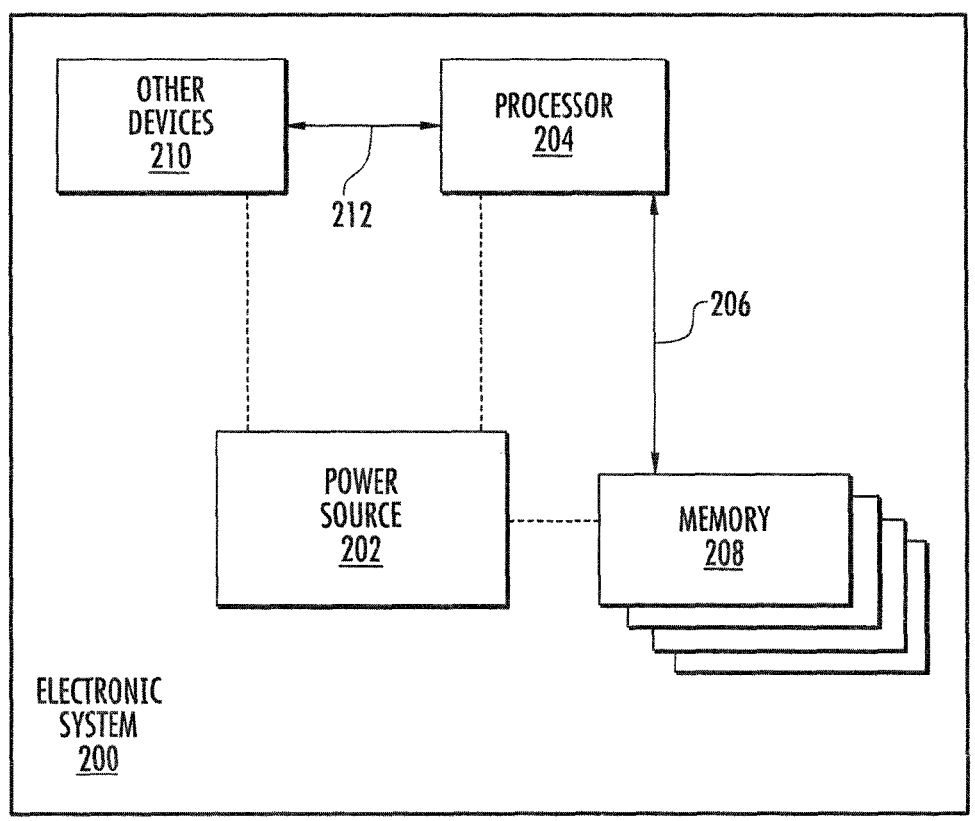
FIG. 14 is a block diagram of an electronic system that can be formed according to an embodiment of the present teachings.

In a particular embodiment depicted in the block diagram of FIG. 14, an electronic system 200 can include a power source (power supply) 202, which may be a converted AC power source or a DC power source such as a DC power supply or battery. System 200 can also include a processor 204, which may be one or more of a microprocessor, microcontroller, embedded processor, digital signal processor, or a combination of two or more of the foregoing. The processor 204 can be electrically coupled by a bus 206 to memory 208. The bus 206 may be one or more of an on chip (or integrated circuit) bus, e.g. an Advanced Microprocessor Bus Architecture (AMBA), an off chip bus, e.g. a Peripheral Component Interface (PCI) bus, or PCI Express (PCIe) bus, a proprietary bus specific to the requirements of the electronic system 200, or some combination of the foregoing. The memory 208 can be one or more of a static random access memory, dynamic random access memory, read only memory, flash memory, or a combination of two or more of the foregoing. The processor 204, bus 206, and memory 208 may be incorporated into one or more integrated circuits and/or other components. The electronic system 200 can include other devices 210 such as other semiconductor devices or subsystems including semiconductor devices, and can be coupled to the processor 204 through a bus 212. Any or all of the processor 204, the memory 208 and/or the other devices 210 can be powered by the power source 202. Any or all of the semiconductor devices included as a part of the electronic system 200 or which interfaces with the electronic system 200 can include one or more thin film resistors according to the present teachings. Electronic systems can include devices related to telecommunications, the automobile industry, semiconductor test and manufacturing equipment, consumer electronics, or virtually any piece of consumer or industrial electronic equipment.

Figure 15:
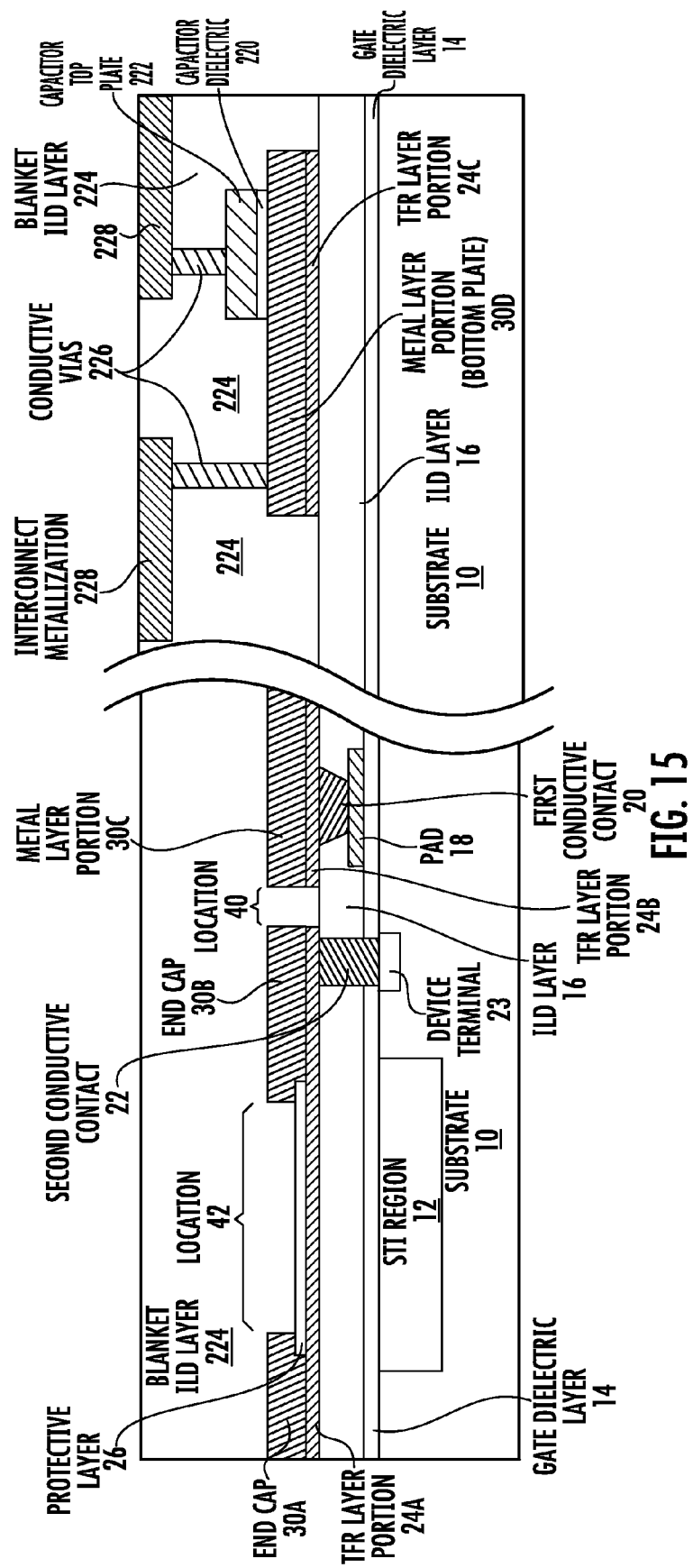
FIG. 15 is a cross section depicting a capacitor which can be formed using layers which also form a portion of a thin film resistor.

FIG. 15 depicts a MIM capacitor and a TFR in accordance with the present teachings. The MIM capacitor can be formed using various layers in common with a TFR as described above, for example the TFR device of FIGS. 4 and 5. FIG. 15 depicts a semiconductor substrate 10 such as a semiconductor wafer, a gate dielectric layer 14, an interlevel dielectric (ILD) layer 16, and various other layers as described above with reference to FIG. 4, depicted on the left side of FIG. 15. FIG. 15 further depicts TFR layer 24C and metal layer portion 30D formed on the right side. Thus TFR layer 24 and metal layer 30 is formed at both the TFR location and the MIM location, and can be used to provide TFR end caps 30A and 30B for the TFR device on the left side and a MIM bottom plate 30D as depicted on the right side. The MIM capacitor of FIG. 15 additionally includes capacitor dielectric 220 and capacitor top plate 222, which can be patterned using the same mask.

During the etch of TFR layer 24C and metal layer 30 to form metal portions 30A, 30B, and 30C as depicted in FIG. 4, the layers can be simultaneously etched to define the bottom plate from TFR layer portion 24C and metal layer portion 30D as depicted in FIG. 15. Subsequently, a blanket ILD layer 224 can be formed over the bottom plate 30D, capacitor dielectric 220, and capacitor top plate, and then patterned to form contact openings which expose top plate 222 and bottom plate 30D. Next, a conductor can be formed to fill the contact openings to provide conductive vias 226, for example using a damascene process, then a Metal 2 layer can be formed to provide interconnect metallization 228 to the vias 226.

The TFR process is thus compatible with the simultaneous formation of other structures such as MIM capacitors on the semiconductor substrate.

Figure 16:
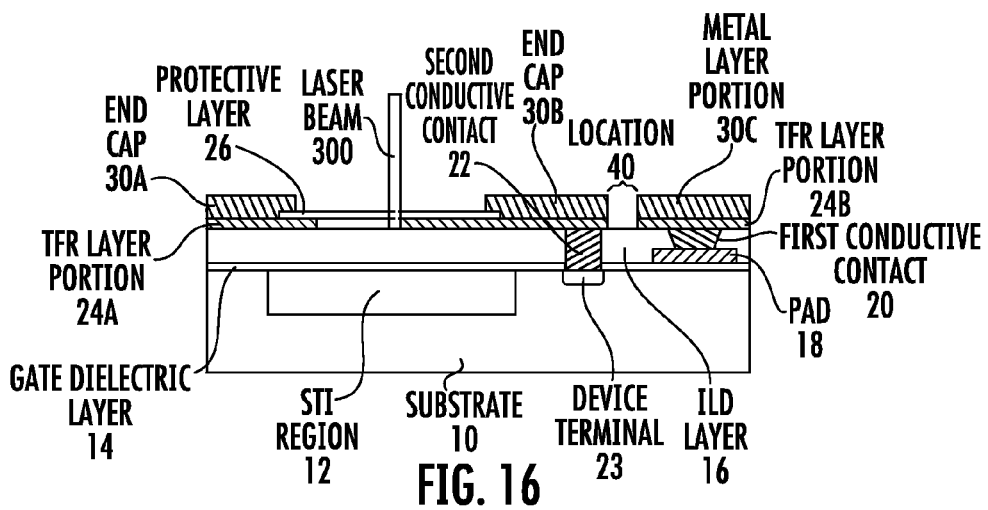
FIG. 16 is a cross section.
Figure 17:
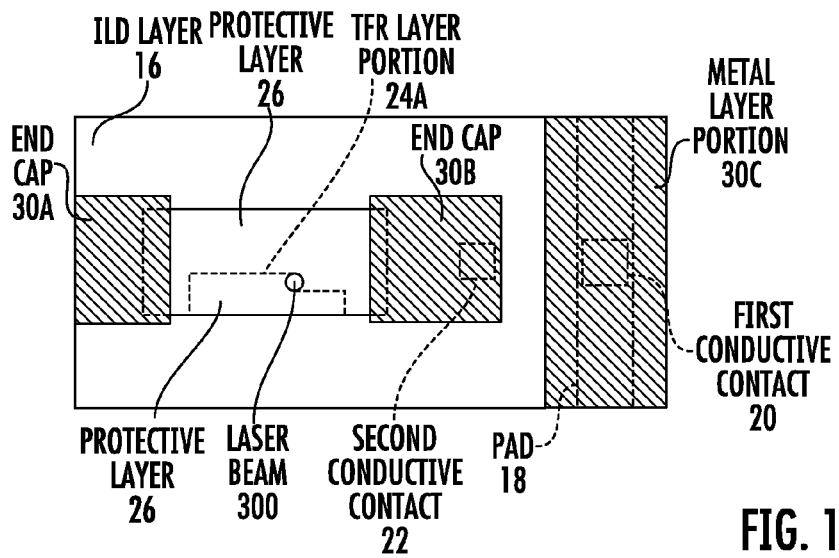
FIG. 17 is a plan view, of a process for altering the resistance of a TFR using a laser beam.

After processing the integrated circuit described above, the resistance of the TFR can be modified by removing a portion of the TFR layer at a location under the protective layer as depicted in FIGS. 16 and 17. For example, a laser beam 300 of appropriate wavelength can be focused on the TFR layer 24A at a location under the protective layer 26 as depicted in FIG. 16 to vaporize (i.e. ablate) portions of the TFR layer 24A as depicted in FIG. 17. The protective layer 26 is generally unaffected by the laser. In FIG. 17, the TFR layer 24A underlies the protective layer 26, and will be ablated where exposed to the laser beam 300. Minor changes in resistance can be accomplished by "shaving" one or more sides of the TFR layer to decrease the width of the TFR layer. This shaving, which can be performed by vaporizing an edge of the TFR with a focused laser beam, can provide an analog trim (i.e. a fine tuning) of the resistance value to improve the integrated circuit precision.

Figure 18:
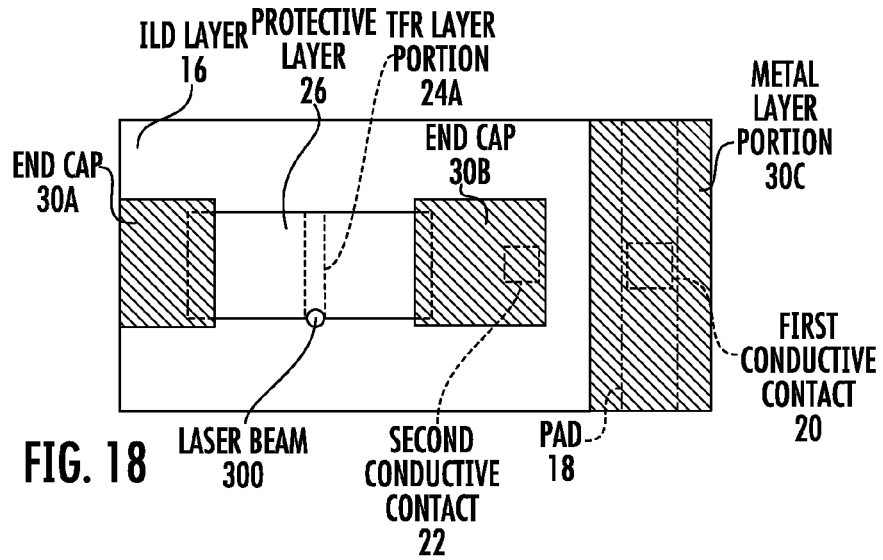
FIG. 18 is a plan view depicting a process for severing a TFR to provide a digital trim.
Figure 19:
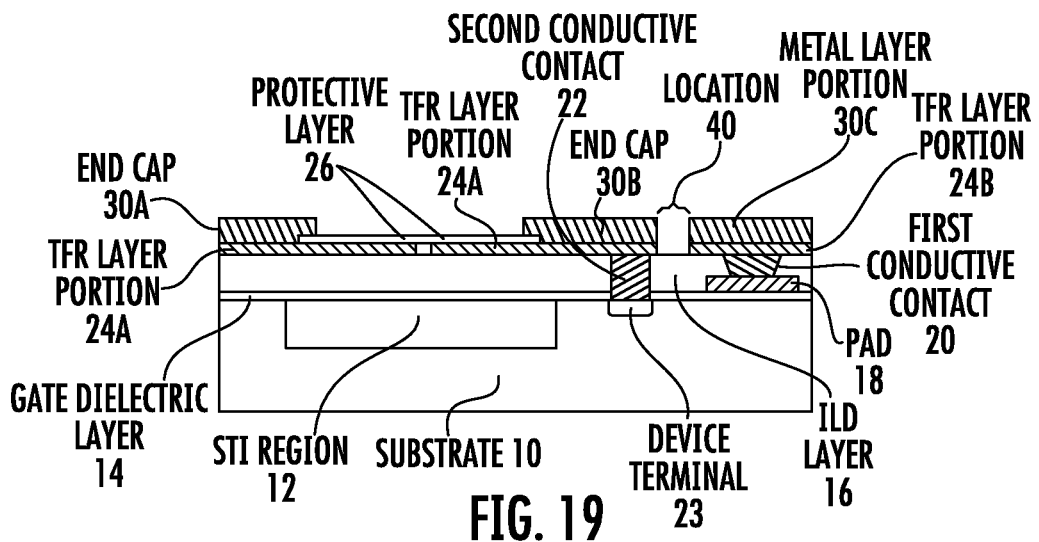
FIG. 19 is a cross section depicting the severed TFR layer.

Alternatively, a more aggressive trimming technique can include completely severing the width of the TFR layer 24A as depicted in FIG. 18, for example using a laser beam 300 so that it becomes an open circuit as depicted in FIG. 19. This could be considered removal of a portion of the TFR layer 24A to provide a digital trim (yes or no) versus an analog trim previously described with reference to FIGS. 16 and 17.

Laser trimming of the thin film resistor will typically be performed on a completed integrated circuit. For simplicity of illustration, the depictions of FIGS. 16 and 18 omit various layers which may be present during trimming, such as overlying dielectric and metallization layers.

Figure 20:
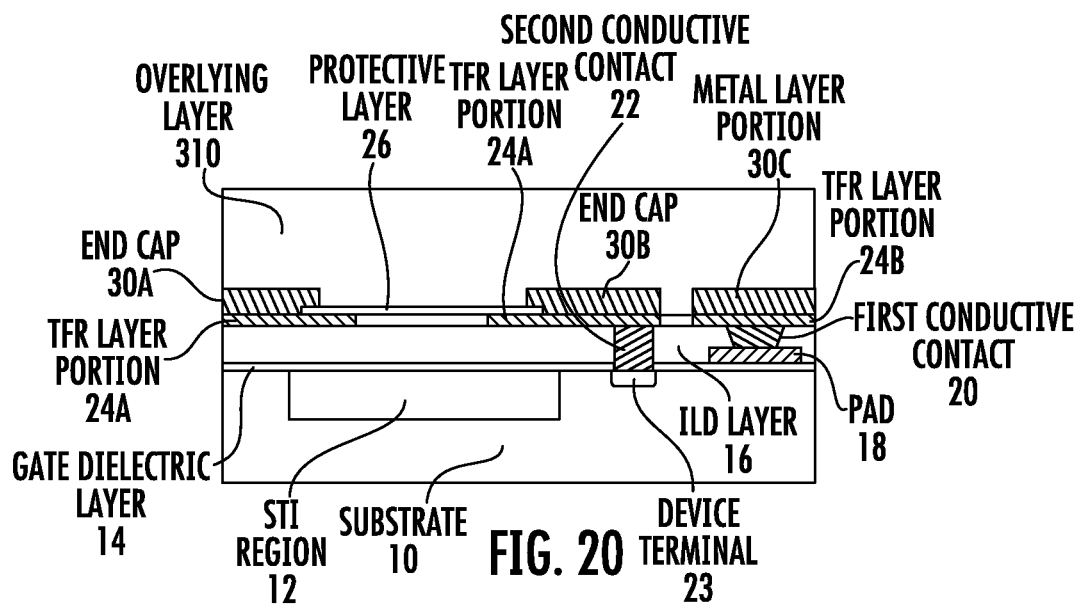
FIG. 20 is a cross section depicting a TFR used as a fuse, wherein the fuse is blown using, for example, an electrical pulse.

In addition, the TFR can be configured as a fuse which can be blown by applying a current or voltage (i.e. a current pulse) through the TFR. The power dissipation across the TFR can melt and/or vaporize the TFR layer 24A as depicted in FIG. 20 so that the TFR no longer conducts electricity and results in an open circuit. This approach would provide similar results to the laser severing technique described above with reference to FIGS. 18 and 19 in that it is a digital trim. An advantage of the fuse technique is that a laser is not required and thus equipment costs can be reduced. Further, severing of the TFR using the fuse technique can be performed post assembly with one or more layers 310 overlying the TFR without requiring direct access to the TFR.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for forming a semiconductor device, comprising:
    forming a conductive thin film resistor (TFR) layer having only one layer over a semiconductor substrate;
    forming a patterned non-conductive protective layer on the TFR layer at a plurality of first locations, wherein the patterned non-conductive protective layer is not formed at a plurality of second locations, and the plurality of first locations lie only between the plurality of second locations;
    forming a blanket conductive layer on the TFR layer at the plurality of second locations and on the patterned non-conductive protective layer; and
    etching the blanket conductive layer at the plurality of first locations and at the plurality of second locations to form a patterned conductive layer, wherein the TFR layer provides an underlayer directly in contact with the etched conductive layer at the plurality of second locations and directly in contact with the patterned non-conductive protective layer at all locations of the patterned non-conductive protective layer, and the underlayer underlies the etched conductive layer at the plurality of second locations and underlies the patterned non-conductive protective layer at the all locations of the patterned non-conductive protective layer.

2. The method of claim 1, further comprising:
    forming the conductive TFR layer as a blanket layer;
    forming the blanket conductive layer over the blanket TFR layer; and
    subsequent to etching the blanket conductive layer, etching the blanket TFR layer at the plurality of second locations.

3. The method of claim 2, further comprising:
    during the etching of the blanket TFR layer at the plurality of second locations, etching the blanket TFR layer at a plurality of third locations to define a capacitor bottom plate from the blanket TFR layer.

4. The method of claim 1 wherein, during the etching of the blanket conductive layer, the non-conductive protective layer prevents etching of the TFR layer at the plurality of first locations.

5. The method of claim 1, further comprising:
the etching of the blanket conductive layer provides resistor end caps for the TFR layer; and
the TFR layer and the resistor end caps form a circuit resistor.

6. The method of claim 5 further comprising:
removing a portion of the TFR layer to alter an electrical resistance of the circuit resistor.

7. The method of claim 6, wherein the removal of the portion of the TFR layer comprises focusing a laser beam on the TFR layer.

8. The method of claim 6, wherein the removal of the portion of the TFR layer comprises shaving one or more sides of the TFR layer to decrease a width of the TFR layer.

9. The method of claim 6, wherein the removal of the portion of the TFR layer comprises completely severing a width of the TFR layer to form an open circuit.

10. The method of claim 6, wherein the removal of the portion of the TFR layer comprises applying a current or voltage through the TFR layer to provide an electrical open.

11. The method of claim 1, further comprising:
etching the blanket conductive layer to provide resistor end caps for the TFR layer;
forming a circuit resistor from the TFR layer and the resistor end caps; and
controlling a width of the non-conductive protective layer to determine, in part, a resistance of the circuit resistor.

12. A method for forming a semiconductor device, comprising: forming a first metal layer over a semiconductor substrate; patterning the first metal layer to form a first resistor end cap and a second resistor end cap; forming a dielectric layer over the first end cap and the second end cap; etching the dielectric layer to form a first contact opening which exposes the first end cap and a second contact opening which exposes the second end cap; forming a second metal layer within the first contact opening to form a first via which electrically contacts the first end cap and within the second contact opening to form a second via which electrically contacts the second end cap; forming a conductive thin film resistor (TFR) layer having only one layer over a semiconductor substrate to electrically contact the first via and the second via; forming a patterned non-conductive protective layer on the TFR layer at a plurality of first locations, wherein the patterned non-conductive protective layer is not formed at a plurality of second locations, and the plurality of first locations lie only between the plurality of second locations; forming a third metal layer on the TFR layer at the plurality of second locations and on the non-conductive protective layer, wherein the TFR layer provides an underlayer directly in contact with the third metal layer at the plurality of second locations and directly in contact with the patterned non-conductive protective layer at all locations of the patterned non-conductive protective layer; and etching the third metal layer and the TFR layer at the plurality of second locations, wherein the patterned non-conductive protective layer prevents etching of portions of the TFR layer, and the underlayer underlies the etched third metal layer at the plurality of second locations and underlies the patterned non-conductive protective layer at the all locations of the patterned non-conductive protective layer.

13. The method of claim 12, further comprising:
forming a circuit resistor from the TFR layer and the resistor end caps.

14. The method of claim 13 further comprising:
removing a portion of the TFR layer to alter an electrical resistance of the circuit resistor.

15. The method of claim 14, wherein the removal of the portion of the TFR layer comprises focusing a laser beam on the TFR layer.

16. The method of claim 14, wherein the removal of the portion of the TFR layer comprises shaving one or more sides of the TFR layer to decrease a width of the TFR layer.

17. The method of claim 14, wherein the removal of the portion of the TFR layer comprises completely severing a width of the TFR layer to form an open circuit.

18. The method of claim 14, wherein the removal of the portion of the TFR layer comprises applying a current or voltage through the TFR layer to provide an electrical open.

19. A semiconductor device comprising a thin film resistor, the thin film resistor comprising: a thin film resistor (TFR) layer having only one layer; a non-conductive protective layer on the TFR layer at a first location and not on the TFR layer at a plurality of second locations; wherein the first location lies only between the second locations; and a conductive layer on the TFR layer at the second location and on the non-conductive protective layer, which forms a first end cap which electrically contacts the TFR layer and a second end cap which electrically contacts the TFR layer, wherein the TFR layer provides an underlayer directly in contact with the conductive layer at the second location and directly in contact with the non-conductive protective layer at all locations of the patterned non-conductive protective layer, and the underlayer underlies the conductive layer at the second location and underlies the non-conductive protective layer at the all locations of the non-conductive protective layer.

20. The semiconductor device of claim 19, further comprising:
a capacitor bottom plate comprising the TFR layer.

21. A semiconductor device comprising a thin film resistor, the thin film resistor comprising: a first resistor end cap and a second resistor end cap; a first conductive via electrically coupled to the first resistor end cap and a second conductive via electrically coupled to the second resistor end cap; a thin film resistor (TFR) layer having only one layer overlying the first resistor end cap, the second resistor end cap, the first conductive via, and the second conductive via, wherein the first conductive via and the second conductive via electrically couple the TFR layer to the first resistor end cap and the second resistor end cap; a non-conductive protective layer on the TFR layer; and a metal layer on the non-conductive protective layer and on the TFR layer, and not under the non-conductive protective layer, wherein the TFR layer provides an underlayer directly in contact with the non-conductive protective layer at all locations of the patterned non-conductive protective layer and an underlayer directly in contact with the metal layer except under the non-conductive protective layer, and the underlayer underlies the metal layer at a plurality of locations and underlies the non-conductive protective layer at the all locations of the non-conductive protective layer, and the metal layer overlies the non-conductive protective layer at the all locations of the non-conductive protective layer.

22. An electronic system, comprising: a thin film resistor, the thin film resistor comprising: a thin film resistor (TFR) layer having only one layer; a non-conductive protective layer on the TFR layer at a first location and not on the TFR layer at a plurality of second locations; wherein the first location lies only between the second locations; and a conductive layer on the TFR layer at the second location and on the non-conductive protective layer, which forms a first end cap which electrically contacts the TFR layer and a second end cap which electrically contacts the TFR layer, wherein the TFR layer provides an underlayer directly in contact with the conductive layer at the second location and directly in contact with the non-conductive protective layer at all locations of the patterned non-conductive protective layer, and the underlayer underlies the conductive layer at the second location and underlies the non-conductive protective layer at the all locations of the non-conductive protective layer; at least one processor; at least one memory device; and a power source which powers the at least one processor and the at least one memory device, wherein the thin film resistor is part of the at least one processor or the at least one memory device.

* * * * *